United States Patent
Miyazaki

[11] Patent Number: 5,636,235
[45] Date of Patent: Jun. 3, 1997

[54] SEMICONDUCTOR LASER DEVICE INCLUDING COLUMNS OF SEMICONDUCTOR LASERS WITH NON-CENTRAL LIGHT EMITTING REGIONS

[75] Inventor: Yasunori Miyazaki, Itami, Japan

[73] Assignee: Mitsubishi Denki Kabushiki Kaisha, Tokyo, Japan

[21] Appl. No.: 524,777

[22] Filed: Sep. 7, 1995

[30] Foreign Application Priority Data

Sep. 7, 1994 [JP] Japan .................................. 6-213651

[51] Int. Cl.$^6$ .................................................. H01S 3/18
[52] U.S. Cl. .............................. 372/44; 372/50; 257/88
[58] Field of Search .................................. 372/43, 44, 50; 257/88.89

[56] References Cited

U.S. PATENT DOCUMENTS

| | | |
|---|---|---|
| 4,916,710 | 4/1990 | Hattori .................................. 372/50 |
| 5,086,431 | 2/1992 | Hardy, Jr. et al. |
| 5,373,174 | 12/1994 | Yamamoto . |

FOREIGN PATENT DOCUMENTS

| | | |
|---|---|---|
| 0447983 | 9/1991 | European Pat. Off. . |
| 61-280693 | 12/1986 | Japan .................................. 372/50 |
| 40-6283807 | 10/1994 | Japan .................................. 372/43 |

Primary Examiner—Rodney B. Bovernick
Assistant Examiner—Yisun Song
Attorney, Agent, or Firm—Leydig, Voit & Mayer

[57] ABSTRACT

A semiconductor laser device includes unit semiconductor lasers having facets and having side surfaces, active layers disposed in the respective unit semiconductor lasers so that the ends of the active layers are exposed to the facets of the respective unit semiconductor lasers and having centers at the facets. Two adjacent columns respectively include unit semiconductor lasers in the same number which are laminated so that light is emitted from each of the unit semiconductor lasers in the same direction. The active layer in the facet of each unit semiconductor laser is located at a position closer to the adjacent column than the center of the facet of the unit semiconductor laser. Therefore, as compared with the prior art array type semiconductor laser device in which the central point of the active layer is located at the center of the facet, i.e., at the center between the side surfaces of the unit semiconductor laser, a region where the active layers are distributed, i.e., a light emitting region, is narrowed, whereby the collection of the emitted light using a lens is facilitated.

5 Claims, 8 Drawing Sheets

SEMICONDUCTOR LASER DEVICE INCLUDING COLUMNS OF SEMICONDUCTOR LASERS WITH NON-CENTRAL LIGHT EMITTING REGIONS

FIELD OF THE INVENTION

The present invention relates to a semiconductor laser device and a fabricating method therefor. More particularly, the invention relates to a semiconductor laser array having light emitting points in a narrow region, and a fabricating method therefor.

BACKGROUND OF THE INVENTION

In order to produce a semiconductor laser device having a higher power output, a plurality of unit, i.e., individual, semiconductor lasers can be integrated to form a semiconductor laser array device. FIGS. 9(a)–9(c) are sectional views illustrating prior art array type semiconductor laser devices. The device includes unit semiconductor lasers 51, each having an active layer 52 centered between side surfaces of the unit semiconductor laser 51. Reference numeral 3 designates a submount, and numeral 4 designates a wire.

As shown in FIG. 9(a), in an array type semiconductor laser device comprising four unit semiconductor lasers 51, active layers 52 are provided in the respective unit semiconductor lasers with a space of 300 μm between the active layers, i.e., light emitting points, of the adjacent unit lasers. The central points of the active layers 52 have a distribution extending over 900 μm. In this case, it is difficult to focus the emitted light on a narrow region using an optical system, such as a lens.

As shown in FIG. 9(b), in an array type semiconductor laser device comprising four unit semiconductor lasers 51 that are vertically laminated, when a thickness of each unit semiconductor laser 51 is 100 μm, the region where the light emitting points are distributed (hereinafter referred to as a light emitting region) extends over 300 μm. When the unit semiconductor laser and the submount, or the unit semiconductor lasers are bonded using solder, it is necessary that the melting point of the solder used for each bond be lower as the bonded portion is more distant from the submount so that a bond does not melt in soldering a subsequent unit semiconductor laser above a previous bond. More specifically, it is necessary to use various kinds of solder having different melting points, which complicates the bonding process.

As shown in FIG. 9(c), when the unit semiconductor lasers 51 that are vertically laminated are divided into two columns, the complication of the solder bonding process is relieved. However, assuming that the space between the side surfaces of the respective unit semiconductor lasers in two columns facing each other is about 100 μm and the width of the unit semiconductor laser 51 is about 300 μm, the space between the light emitting points in the horizontal direction becomes about 400 μm, so that the light emitting region is widened to 100 (length)×400 (width) μm² as compared with the structure of FIG. 9(b). Accordingly, it is difficult to focus the emitted light on a narrow region. Although it is thought that the width of the unit semiconductor laser 51 may be narrowed to reduce the size of the light emitting region, a width of 200 μm or more is required to radiate heat sufficiently and facilitate handling. Therefore, there is a limit to reducing this width to narrow the light emitting region.

As described above, in the array type semiconductor laser device divided into two columns, the process for bonding with the solder is simpler than that in the array type semiconductor laser device comprising four unit semiconductor lasers that are vertically laminated. However, the light emitting region is widened, so that it is difficult to collect the emitted light using a lens.

SUMMARY OF THE INVENTION

It is an object of the present invention to provide an array type semiconductor laser device in which light emitting points are concentrated in a narrow region and which is fabricated by simple processes, and a fabricating method therefor.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a semiconductor laser device includes two adjacent columns respectively comprising unit semiconductor lasers in the same number that are vertically laminated so that light is emitted from each of the unit semiconductor lasers in the same direction. The central point of an active layer in a facet of each unit semiconductor laser is located at a position closer to the adjacent column than to the center of the facet of the unit semiconductor laser. Therefore, as compared with the prior art array type semiconductor laser device in which the central point of the active layer is located at the center of the facet, i.e., at the center between both side surfaces of the unit semiconductor laser, a region where the active layer is distributed, i.e., a light emitting region, is narrowed, whereby collection of the emitted light using a lens is facilitated.

According to a second aspect of the present invention, in the semiconductor laser device, the adjacent unit semiconductor lasers of the two columns are in contact with each other at the side surfaces. Therefore, since the space between the active layers of the adjacent unit semiconductor lasers of the two columns becomes narrower than when there is a space between the side surfaces of the unit semiconductor lasers facing each other, the light emitting region is narrowed, whereby the collection of the emitted light using a lens is facilitated.

According to a third aspect of the present invention, in the semiconductor laser device, the unit semiconductor lasers of each column comprise two unit semiconductor lasers, vertically laminated, and the central points of the active layers in the upper and lower unit semiconductor lasers of each column are located at positions below and above the centers of the facets of the unit semiconductor lasers, respectively. Therefore, since the space between the active layers of the adjacent unit semiconductor lasers becomes narrower and the space between the active layers of the unit semiconductor lasers laminated in the vertical direction becomes narrower, the light emitting region is narrowed, whereby the collection of emitted light using a lens is facilitated.

According to a fourth aspect of the present invention, in the semiconductor laser device, the unit semiconductor lasers of each column comprise two unit semiconductor lasers, vertically laminated, the adjacent unit semiconductor lasers of the two columns are in contact with each other at the side surfaces, and the central points of the active layers in the upper and lower unit semiconductor lasers of each column are located at positions below and above the centers of the facets of the unit semiconductor lasers, respectively. Therefore, since the space between the active layers of the adjacent unit semiconductor lasers is narrower than when there is a space between the side surfaces of the unit semiconductor lasers facing each other and the space between the active layers of the unit semiconductor lasers laminated in the vertical direction is narrower, the light emitting region is narrowed, whereby the collection of the emitted light using a lens is facilitated.

According to a fifth aspect of the present invention, a method of fabricating a semiconductor laser device includes cutting a unit semiconductor laser structure, in which a front surface electrode is formed on the front surface of the laser structure and a rear surface electrode is formed at the rear surface, to form a facet of each unit semiconductor laser and a semiconductor laser bar, in which the unit semiconductor lasers are arranged in an array with the side surfaces in contact with each other. An active layer of each unit semiconductor laser is located at a position closer to one side surface of the unit semiconductor laser than to the center of the facet, cutting the semiconductor laser bar at one side surface of the unit semiconductor lasers to divide the bar into first and second semiconductor laser bars, depositing a low-reflectance film on the front facets of the first semiconductor laser bar and the back facets of the second semiconductor laser bar and depositing a high-reflectance film on the back facets of the first semiconductor laser bar and the front facets of the second semiconductor laser bar, cutting the first and second semiconductor laser bars into a plurality of unit semiconductor lasers, and laminating on a submount unit semiconductor lasers in the same number that are respectively cut out of the first and second semiconductor laser bars and bonding them to each other so that two adjacent columns are formed. The facets on which the low-reflectance films are deposited are put in the same plane, the side surfaces of the unit semiconductor lasers of each column to which the active layers are closer face each other, the front surface electrode is directed upward, and the rear surface electrode is directed downward. Therefore, in an array type semiconductor laser fabricated by the described method, since the active layer is located closer to the side surface of the unit semiconductor laser facing the adjacent unit semiconductor laser than to the center between both side surfaces, it is possible to narrow the space between the active layers, i.e., the light emitting region, as compared with the prior art array type semiconductor laser device in which the central point of the active layer is located at the center of the facet, i.e., at the center between both side surfaces of the unit semiconductor laser. Thereby, the collection of the emitted light using a lens is facilitated. In addition, assuming that the unit semiconductor lasers of the same number as in the prior art are employed, since the number of the unit semiconductor lasers vertically laminated in each column is half the number of the unit semiconductor lasers vertically laminated in an array according to the prior art, the kinds of solder having different melting points can be reduced by half, simplifying the process for the bonding the lasers. Meanwhile, since one unit semiconductor laser is the same size as in the prior art, the heat radiation effect and the handling of the unit semiconductor laser in the process for bonding are the same as in the prior art.

According to a sixth aspect of the present invention, a method of fabricating a semiconductor laser device includes cutting a unit semiconductor laser structure in which a front surface electrode is formed on the front surface of the laser structure and a rear surface electrode is formed at the rear surface, to form a facet of each unit semiconductor laser and an opposing type semiconductor laser bar, in which the unit semiconductor lasers are arranged in an array with the side surfaces in contact with each other. A plurality of pairs of the unit semiconductor lasers that oppose each other are arranged so that active layers are located close to the interfaces between the opposing unit semiconductor lasers of each pair, depositing a low-reflectance film on the front facets of the opposing type semiconductor laser bar and depositing high-reflectance films on the back facets thereof, cutting the opposing type semiconductor laser bars at the interfaces far from the active layers between pairs of the opposing unit semiconductor lasers into a plurality of opposing type semiconductor laser chips, each chip comprising a pair of the opposing unit semiconductor lasers in contact with each other at the side surfaces close to the active layers, and laminating on a submount the opposing type semiconductor laser chips and bonding the chips to each other so that the facets on which the low-reflectance films are deposited are in the same plane, the front surface electrode is directed upward, and the rear surface electrode is directed downward. Therefore, in an array type semiconductor laser fabricated by this method, since a unit semiconductor laser is in contact with an adjacent unit semiconductor laser at side surfaces, it is possible to narrow the space between the active layers of the adjacent unit semiconductor lasers, i.e., the light emitting regions, as compared with the array type semiconductor laser device according to the fifth aspect of the invention. Thereby, the collection of the emitted light using a lens is facilitated. In addition, since the number of the opposing type semiconductor laser chips vertically laminated is half the number of the unit semiconductor lasers vertically laminated in an array according to the prior art, the kinds of solder having different melting points can be reduced by half, simplifying the solder bonding process. Also, the number of areas that are solder bonded is halved as compared with the fabricating method including vertically laminating the unit semiconductor lasers in two arrays according to the fifth aspect of the invention, whereby the process for the bonding is simplified. Further, since it is not required to divide the semiconductor laser bar into first and second bars, the process is easier. Furthermore, since it is not required to cut all unit semiconductor lasers and the cutting portions for cutting the opposing type semiconductor laser chips are reduced by half, the cutting process is simplified. Meanwhile, since an opposing type semiconductor laser chip is twice as large as the prior art unit semiconductor laser, the handling of the chip in the bonding process is easier than the prior art. Since the unit semiconductor laser is of the same size as the prior art device, the heat radiation effect is the same as in the prior art.

According to a seventh aspect of the present invention, a method of fabricating a semiconductor laser device includes cutting a unit semiconductor laser structure in which a front surface electrode is formed on the front surface of the laser structure and a rear surface electrode is formed at the rear surface, to form a facet of each unit semiconductor laser of a semiconductor laser bar, in which the unit semiconductor lasers are arranged in an array in contact with each other at side surfaces and an active layer of each unit semiconductor laser is located at the center of the facet, depositing a low-reflectance film on the front facets of the semiconductor laser bar and depositing high-reflectance films on the back facets, cutting the semiconductor laser bar into a plurality of unit semiconductor lasers, laminating on a submount the unit semiconductor lasers and bonding them to each other so that the facets on which the low-reflectance films are disposed are in the same plane, the front surface electrode is directed upward, and the rear surface electrode is directed downward, and cutting the laminated unit semiconductor lasers at the plane passing the center of the unit semiconductor lasers and parallel to the side surface, thereby forming a semiconductor laser device comprising a plurality of divided unit semiconductor lasers emitting light in the same direction and laminated in two arrays so that the respective active layers face each other. Therefore, in an array type semiconductor laser fabricated by the described method, since the divided active layer is located at a position closer to the side surface of the divided unit semiconductor laser facing the adjacent divided unit semiconductor laser than to the center between both side surfaces, so that one end of the divided active layer is exposed to the side surface of the divided unit semiconductor laser, it is possible to narrow the space between the active layers, i.e., the light emitting region, as compared with the array type semiconductor laser devices according to the prior art. Thereby, the collection of the emitted light using a lens is facilitated. In addition, since the number of the unit semiconductor lasers vertically laminated in each column is half the number of the unit semiconductor lasers vertically laminated in an array according to the prior art, the kinds of solder having different melting points is reduced by half, which simplifies the solder bonding process. Also, the number of portions bonded with the solder is halved as compared with the fabricating method including vertically laminating the unit semiconductor lasers into two arrays according to the fifth aspect of the invention, whereby the process for the bonding is simplified. Further, since it is not required to divide the semiconductor laser bar into first and second bars, the process is made easier. Meanwhile, since a unit semiconductor laser is twice as large as the prior art unit semiconductor laser, the handling of the chip in bonding is easier than in the prior art. Since the divided unit semiconductor laser is the same size as the prior art device, the heat radiation effect is the same as in the prior art.

According to an eighth aspect of the present invention, a method of fabricating a semiconductor laser device includes cutting first and second unit semiconductor laser structures, in which front surface electrodes are formed on the front surfaces of the respective laser structures and rear surface electrodes are formed at the rear surfaces thereof, an active layer of each unit semiconductor laser is located closer to the front surface electrode than to the rear surface electrode, and the conductivity types of semiconductor layers respectively constituting the first and second laser structures between the front and rear surface electrodes, except the active layers, are opposite to each other, to form a facet of each unit semiconductor laser thereby forming first and second opposing type semiconductor laser bars, respectively, in which the unit semiconductor lasers are arranged in an array in contact with each other at the side surfaces and a plurality of pairs of unit semiconductor lasers that oppose each other are disposed so that active layers thereof are located at positions close to the interfaces between the opposing unit semiconductor lasers of each pair, depositing low-reflectance films on the front facets of the opposing type semiconductor laser bars and depositing high-reflectance films on the back facets thereof, cutting the first and second opposing type semiconductor laser bars at the interfaces far from the active layers between pairs of the opposing unit semiconductor lasers into first and second opposing type semiconductor laser chips, respectively, each chip comprising a pair of opposing unit semiconductor lasers in contact with each other at the side surfaces close to the active layers, and bonding the first semiconductor laser chip cut out of the first unit semiconductor laser structure with the rear surface electrode downward to a submount and bonding the second semiconductor laser chip cut out of the second unit semiconductor laser structure with the front surface electrode directed downward to the front surface electrode of the first semiconductor laser chip so that the facets of the first and second semiconductor laser chips on which the low-reflectance films are deposited are in the same plane. In an array type semiconductor laser fabricated by the described method, since the side surfaces of the unit semiconductor laser and the adjacent unit semiconductor laser are in contact with each other, it is possible to narrow the space between the active layers of the adjacent unit semiconductor lasers, as compared with the array type semiconductor laser device according to the fifth aspect of the invention in which there is a space between the adjacent side surfaces of the unit semiconductor lasers of the two columns. Further, since the space between the active layers in the vertical direction can be narrower than those in the fabricating methods according to the fifth to seventh aspects of the invention, it is possible to narrow the light emitting region, whereby the collection of the emitted light using a lens is further facilitated. In addition, since the number of opposing type semiconductor laser chips vertically laminated is half the number of the unit semiconductor lasers vertically laminated in an array according to the prior art, the kinds of solder having different melting points can be reduced by half, which simplifies the solder bonding process. Also, four portions bonded with the solder in the fabricating method including vertically laminating the unit semiconductor lasers into two arrays according to the fifth aspect of the invention are decreased to two, whereby the process for the bonding is simplified. Further, since it is not required to divide the semiconductor laser bar into the first and second bars, the process is made easier. Furthermore, since it is not required to cut all unit semiconductor lasers and the cutting portions for cutting the opposing type semiconductor laser chips are reduced by half, the cutting process is simplified. Meanwhile, since an opposing type semiconductor laser chip is twice as large as the prior art unit semiconductor laser, the handling of the chip is easier than in the prior art. Since the unit semiconductor laser is the same size as in the prior art, the heat radiation effect is the same as in the prior art.

DETAILED DESCRIPTION OF THE PREFERRED EMBODIMENTS

Embodiment 1

Figure 1:
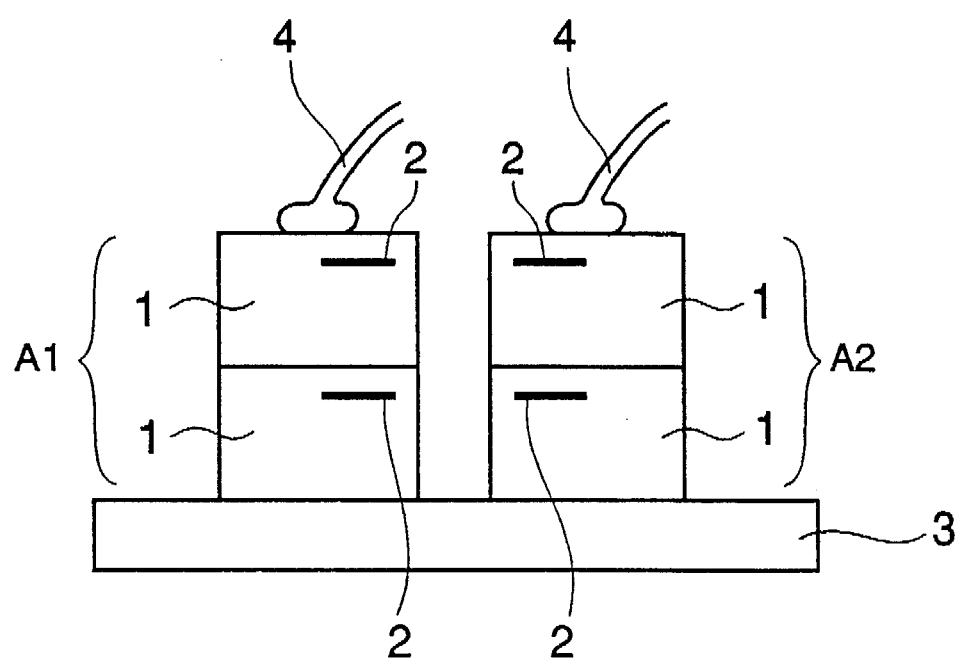
FIG. 1 is a front view illustrating an array type semiconductor laser device in accordance with a first embodiment of the present invention.

FIG. 1 is a front view illustrating an array type semiconductor laser device according to a first embodiment of the invention. In the figure, reference numeral 1 designates a unit semiconductor laser, numeral 2 designates an active layer, numeral 3 designates a submount, numeral 4 designates a wire, and numerals A1 and A2 designate first and second columns, respectively. The unit semiconductor lasers are disposed as in the prior art array type semiconductor laser device shown in FIG. 9(c). However, while the active layer of each unit semiconductor laser in the prior art is disposed at an upper central position of the unit semiconductor laser facet, the active layers of the unit semiconductor lasers in this first embodiment of the invention are disposed at an upper position and offset, i.e., closer, to the side surface of the unit semiconductor laser facing the adjacent column than to the center of the facet.

Figure 2:
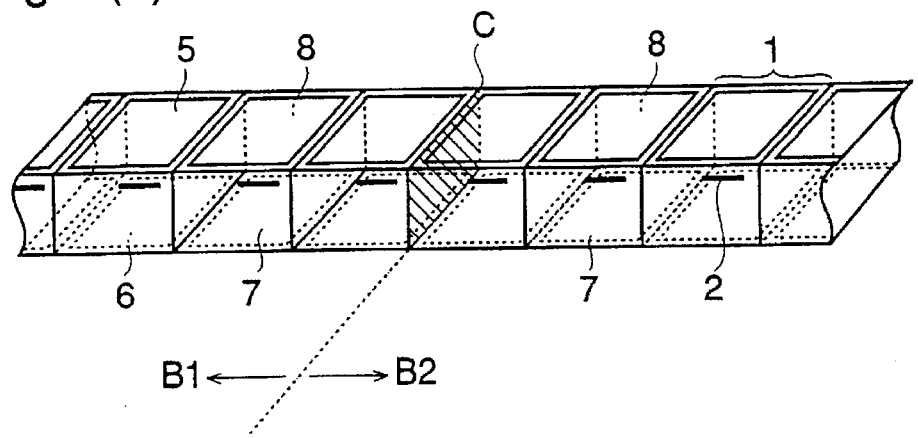
FIGS. 2(a)–2(c) are perspective views illustrating process steps in a method of fabricating an array type semiconductor laser device in accordance with the first embodiment of the invention.
Figure 2:
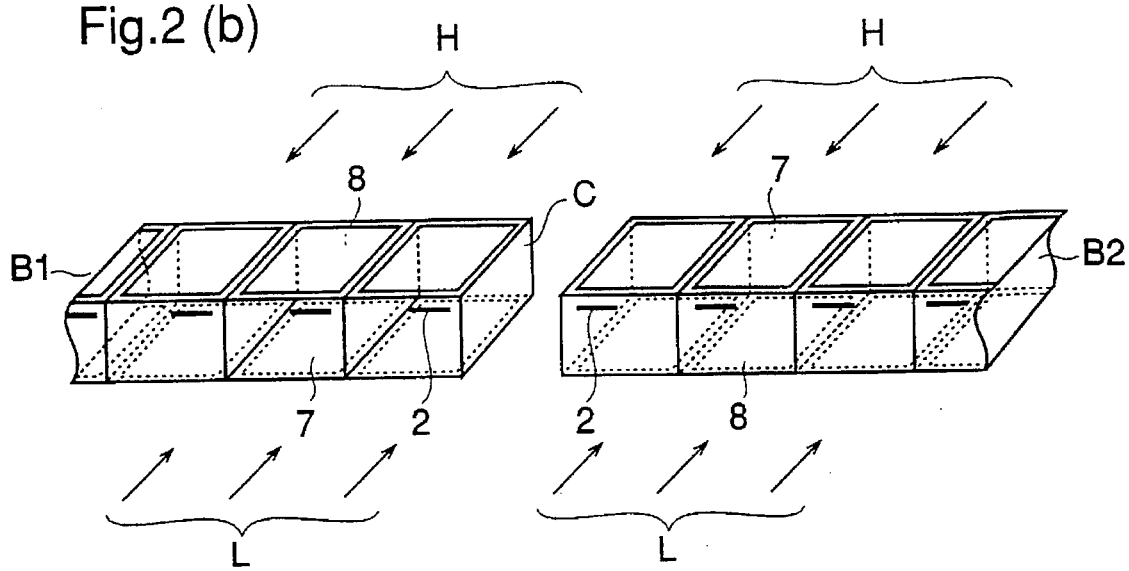
Figure 2:
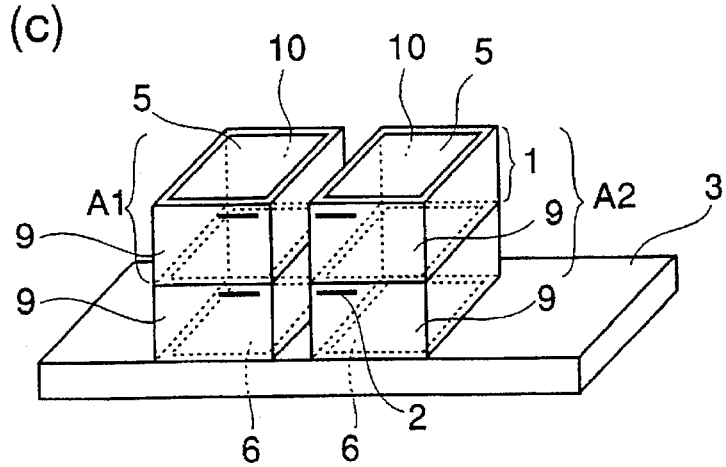

FIGS. 2(a)–2(c) are perspective views illustrating process steps in a method of fabricating an array type semiconductor laser device. Initially, a semiconductor wafer including semiconductor lasers is laminated on a substrate. After the rear surface of the substrate is ground, a front surface electrode 5 is formed on the front surface of the semiconductor wafer and a rear surface electrode 6 is formed at the rear surface. Then, as shown in FIG. 2(a), a semiconductor laser bar in which a plurality of unit semiconductor lasers 1 having the same structure are arranged in an array is cut out of the semiconductor wafer, forming a facet of each unit semiconductor laser. The unit semiconductor lasers arranged in an array are in contact with each other at their side surfaces. In this case, the lamination of the semiconductor wafer and the formation of the front and rear surface electrodes 5 and 6 are carried out so that an active layer 2 of each unit semiconductor laser 1 is located closer to one side surface of the unit semiconductor laser than to the center of the facet. The facets on the front and back sides in the figure are called a front facet 7 and a back facet 8, respectively. Thereafter, the semiconductor laser bar is cut at one side surface of the unit semiconductor lasers of this bar. In the figure, C represents this side surface. Therefore, the semiconductor laser bar is divided into a first semiconductor laser bar B1 and a second semiconductor laser bar B2.

In the step of FIG. 2(b), the front facets 7 of the first semiconductor laser bar B1 and the back facets 8 of the second semiconductor laser bar B2 are turned toward the same direction, and a low-reflectance film 9 is deposited by evaporation on these facets. Likewise, the back facets 8 of the first semiconductor laser bar B1 and the front facets 7 of the second semiconductor laser bar B2 are turned toward the same direction, and a high-reflectance film 10 is deposited by evaporation on these facets. In the figure, L represents a low-reflectance film evaporation direction, and H represents a high-reflectance film evaporation direction. These directions are directions to which atoms or molecules of the evaporated material flow during film deposition. In a laser producing light having a wavelength of 1.55 µm, an alumina ($Al_2O_3$) film can be used as a low-reflectance film, and a film comprising two layers, i.e., alumina and amorphous silicon, can be used as a high-reflectance film.

After cutting the unit semiconductor lasers out of the first and second semiconductor laser bars, in the step of FIG. 2(c), two columns A1 and A2, each column comprising two unit semiconductor lasers 1 laminated with the front surface electrode 5 upward and the rear surface electrode 6 downward, are mounted on a submount 3. The left column A1 in the figure comprises the unit semiconductor lasers cut out of the first semiconductor laser bar B1 and the right column A2 comprises the unit semiconductor lasers cut out of the second semiconductor laser bar B2, and the facets on which the low-reflectance film 9 is deposited are in the same plane. Therefore, as is shown in the figure, the active layer 2 is located closer to the side surface of the unit semiconductor laser facing the adjacent column than to the center of the facet. In addition, the facet of the unit semiconductor laser 1 on the front side is the facet on which the low-reflectance film 9 is deposited and the facet on the back side is the facet on which the high-reflectance film 10 is deposited. The submount 3 and the unit semiconductor laser 1 or the unit semiconductor lasers are bonded using solder. Finally, bonding of wires 4 is performed, resulting in the array type semiconductor laser device shown in FIG. 1.

In an array type semiconductor laser device according to the first embodiment of the invention, when a forward bias voltage is applied across the front surface electrode 5 of the upper unit semiconductor laser 1 of each column and the submount 3, a current flows between the electrode and the submount, whereby laser oscillation occurs at the active layer 2 of the unit semiconductor laser 1 and laser light is emitted from the facet on which the low-reflectance film 9 is deposited.

Figure 9:
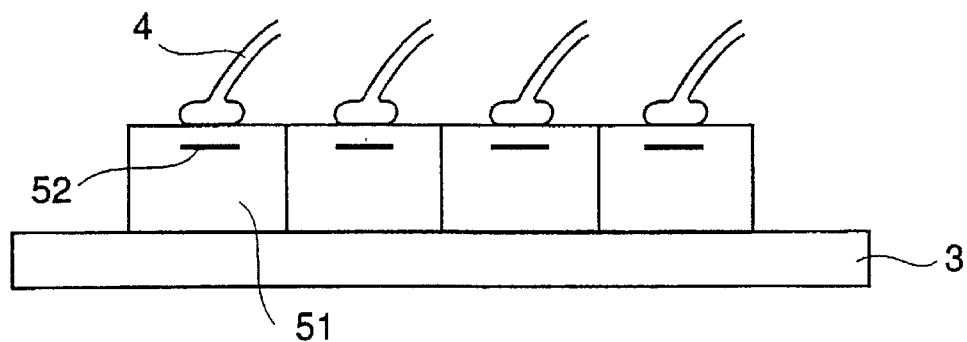
FIGS. 9(a)–9(c) are sectional views illustrating array type semiconductor laser devices according to the prior art.
Figure 9:
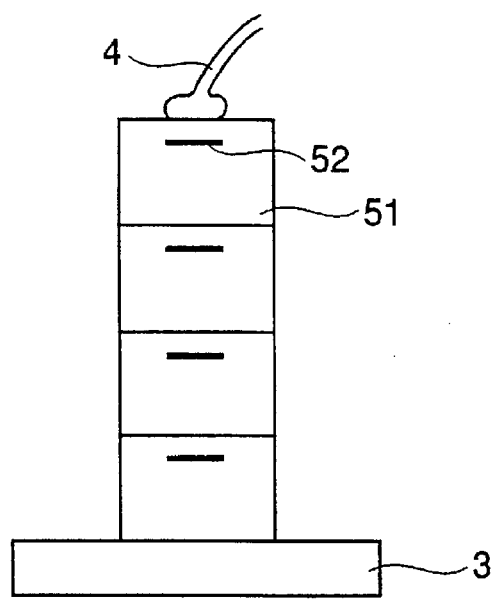
Figure 9:
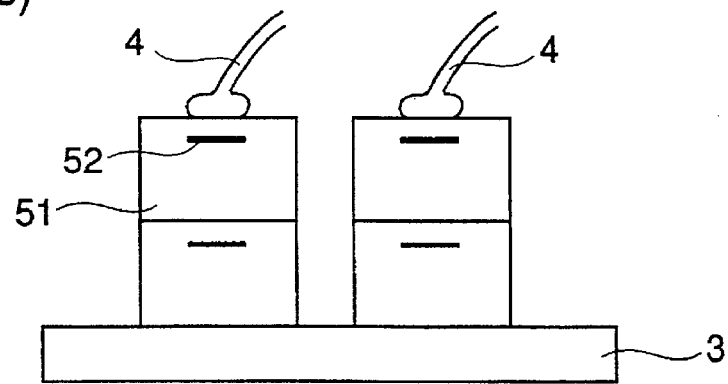

In this first embodiment of the invention, since the active layer 2 is located at a position closer to the side surface of the unit semiconductor laser 1 facing the adjacent column than to the other side surfaces, it is possible to narrow the space between the light emitting points, as compared with the prior art array type semiconductor laser device shown in FIG. 9(c). In fact, the width of the unit semiconductor laser 1 is 300 µm and the space between the side surfaces of the respective unit semiconductor lasers of two columns facing each other is 100 µm. Therefore, assuming that the active layer 2 is closer to the side surface of the unit semiconductor laser 1 facing the adjacent column than to the other side surfaces by 50 µm, the space between the light emitting points in the horizontal direction becomes 300 µm, so that the space can be narrowed by 100 µm, as compared with the prior art structure shown in FIG. 9(c). Consequently, the light emitting region can be narrower than in the prior art, whereby the collection of the emitted light using a lens can be facilitated.

In addition, since two unit semiconductor lasers 1 are vertically laminated in one column, the kinds of solder having different melting points when four unit semiconductor lasers are vertically laminated according to the prior art can be reduced by half, simplifying the process for bonding with solder. Meanwhile, since one unit semiconductor laser 1 is the same size as the prior art, heat radiation and handling of the unit semiconductor laser are the same as the prior art.

Embodiment 2

Figure 3:
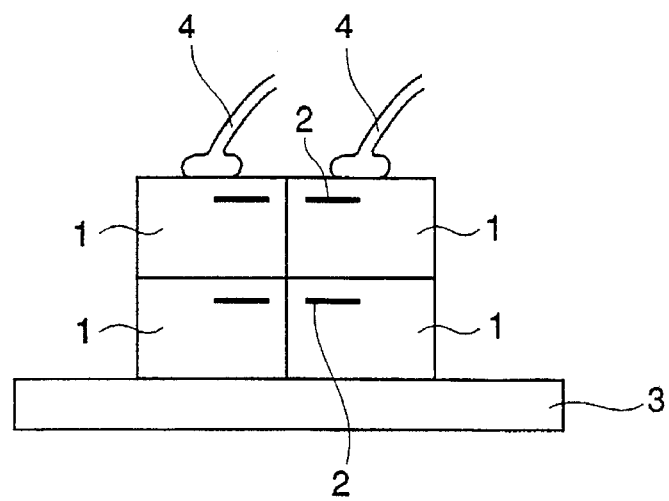
FIG. 3 is a front view illustrating an array type semiconductor laser device in accordance with a second embodiment of the present invention.

FIG. 3 is a front view illustrating an array type semiconductor laser device according to the second embodiment of the invention. In the figure, reference numeral 1 designates a unit semiconductor laser, numeral 2 designates an active layer, numeral 3 designates a submount, and numeral 4 designates a wire. The unit semiconductor lasers are disposed basically as in the array type semiconductor laser device of the first embodiment of the invention, except that there is no space between two columns that comprise two unit semiconductor lasers vertically-laminated as in the first embodiment and these two columns are in contact with each other. The active layer of each unit semiconductor laser is disposed closer to the side surface of the unit semiconductor laser in contact with an adjacent unit semiconductor laser than to the center of the facet.

Figure 4:
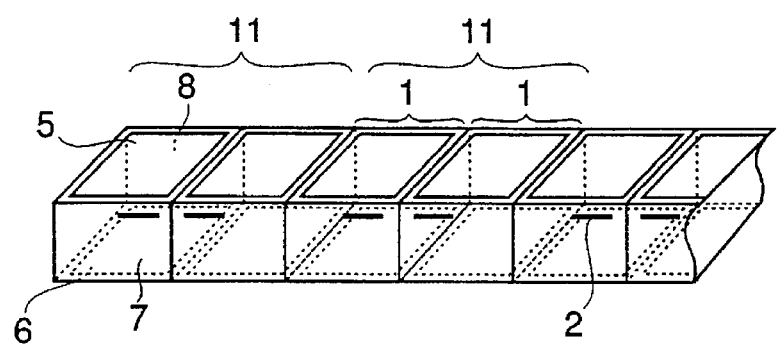
FIGS. 4(a) and 4(b) are perspective views illustrating process steps in a method of fabricating an array type semiconductor laser device in accordance with the second embodiment of the invention.
Figure 4:
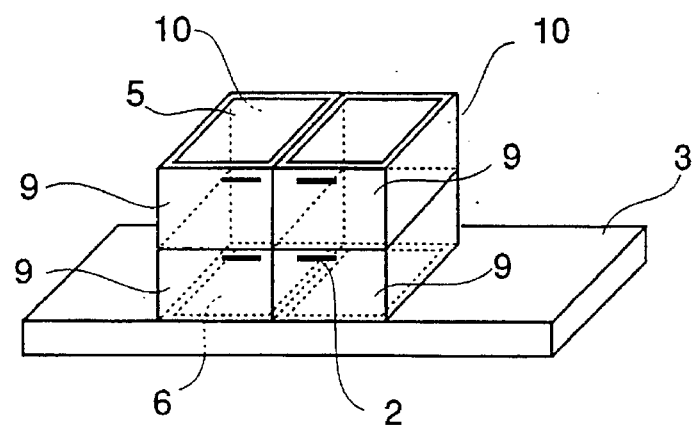

FIGS. 4(a) and 4(b) are perspective views illustrating process steps in a method of fabricating an array type semiconductor laser device. Initially, a semiconductor wafer including semiconductor lasers is laminated on a substrate. After the rear surface of the substrate is ground, a front surface electrode 5 is formed on the front surface of the semiconductor wafer and a rear surface electrode 6 is formed at the rear surface. Then, as shown in FIG. 4(a), a semiconductor laser bar in which a plurality of unit semiconductor lasers 1 having the same structure are arranged in an array is cut out of the semiconductor wafer, forming a facet of each unit semiconductor laser 1. The unit semiconductor lasers arranged in an array are in contact with each other at the side surfaces. In this case, the lamination of the semiconductor lasers and the formation of the front and rear surface electrodes 5 and 6 are carried out so that active layers 2 of the respective unit semiconductor lasers 1 are located closer to the interface between the adjacent unit semiconductor lasers of each pair than to the centers of the facets of the respective unit semiconductor lasers. The facets on the front and back sides in the figure are called a front facet 7 and a back facet 8, respectively.

A low-reflectance film 9 is deposited by evaporation on the front facet 7, and a high-reflectance film 10 is deposited by evaporation on the back facet 8. As in the first embodiment, in a laser producing light having a wavelength of 1.55 µm, an alumina ($Al_2O_3$) film can be used as a low-reflectance film, and a film comprising two layers, alumina and amorphous silicon, can be used as a high-reflectance film. Then, opposing type semiconductor laser chips 11, each chip comprising two unit semiconductor lasers 1 that are adjacent to each other and in which the active layers 2 are located close to the side surfaces of the unit semiconductor lasers 1 in contact with each other, are cut out of the semiconductor laser bar.

Then, in the step of FIG. 4(b), a column comprising two opposing type semiconductor laser chips 11 laminated with the front surface electrode 5 upward and the rear surface electrode 6 downward, is formed on a submount 3. In this structure, the facets on which the low-reflectance film 9 is deposited are in the same plane. Therefore, as is shown in the figure, the active layer 2 is located closer to the side surface of the unit semiconductor laser 1 in contact with the adjacent unit semiconductor laser than to the center of the facet. In addition, the facet of the unit semiconductor laser 1 on the front side is the facet on which the low-reflectance film 9 is deposited and the facet on the back side is the facet on which the high-reflectance film 10 is deposited. The submount 3 and the opposing type semiconductor laser chip 11 or the opposing type semiconductor laser chips are bonded using AuSn solder. Finally, bonding of wires 4 is performed, resulting in the array type semiconductor laser device shown in FIG. 3.

In an array type semiconductor laser device according to the second embodiment of the invention, when a forward bias voltage is applied across the upper front surface electrode 5 of the column comprising the opposing type semiconductor laser chips 11 and the submount 3, a current flows between the electrode and the submount, whereby laser oscillation occurs at the active layers 2 of the unit semiconductor lasers 1 and laser light is emitted from the facet on which the low-reflectance film 9 is deposited.

In this second embodiment of the invention, since the active layer 2 is located closer to the side surface of the unit semiconductor laser 1 in contact with the adjacent unit semiconductor laser than to the outside side surfaces, it is possible to narrow the space between the light emitting points, as compared with the array type semiconductor laser devices of the prior art shown in FIG. 9(c) and of the first embodiment of the invention. In fact, although the width of the unit semiconductor laser 1 is 300 µm as in the first embodiment, while in the first embodiment the space between the side surfaces of the respective unit semiconductor lasers of two columns facing each other is 100 µm, in this second embodiment these side surfaces are in contact with each other. Therefore, assuming that the central point of the active layer 2 is closer to the side surface of the unit semiconductor laser 1 in contact with the adjacent unit semiconductor laser than to the center between the outside side surfaces by 50 µm, the space between the light emitting points in the horizontal direction becomes 200 µm, so that the space can be narrowed not only by 200 µm as compared with the prior art shown in FIG. 9(c) but by 100 µm as compared with the first embodiment. Consequently, the light emitting region can be narrower than in the prior art and the first embodiment of the invention, whereby the collection of the emitted light using a lens is facilitated.

In addition, since two opposing type semiconductor laser chips 11 are vertically laminated, the kinds of solder having different melting points when four unit semiconductor lasers are vertically laminated according to the prior art can be reduced by half, simplifying the solder bonding process. In the second embodiment of the invention, the four portions bonded with the solder in the first embodiment are decreased to two, whereby the process for the bonding is simplified. Further, since it is not necessary to divide the semiconductor laser bar into the first and second bars as in the first embodiment, the process is made easier.

Furthermore, since it is not necessary to cut all unit semiconductor lasers as in the first embodiment and the portions for cutting the opposing type semiconductor laser chips 11 are reduced by half, the cutting process is simplified. Meanwhile, since one opposing type semiconductor laser chip 11 is twice as large as the prior art unit semiconductor laser, the handling of the chip in the bonding process is easier than in the prior art. Since the unit semiconductor laser 1 is the same size as the prior art, the heat radiation is the same as in the prior art.

Embodiment 3

Figure 5:
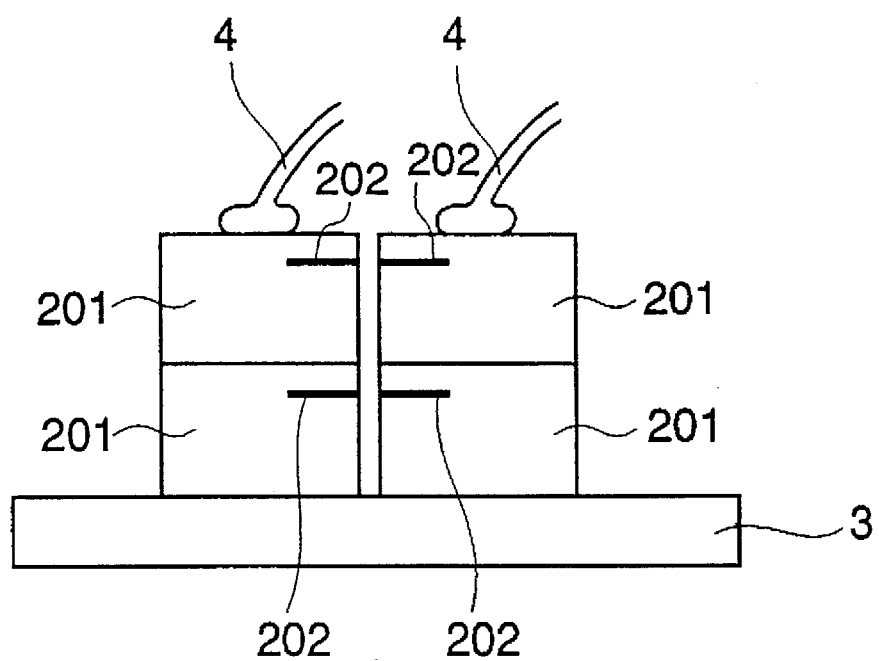
FIG. 5 is a front view illustrating an array type semiconductor laser device in accordance with a third embodiment of the present invention.

FIG. 5 is a front view illustrating an array type semiconductor laser device according to the third embodiment of the invention. In the figure, reference numeral 201 designates a divided unit semiconductor laser, numeral 202 designates a divided active layer, numeral 3 designates a submount, and numeral 4 designates a wire. The divided unit semiconductor lasers are formed by cutting the center of one unit semiconductor laser 21 as described later. These divided unit semiconductor lasers are disposed as the unit semiconductor lasers in the prior art array type semiconductor laser device shown in FIG. 9(c). However, while the active layer of the prior art unit semiconductor laser is disposed at the center of the unit semiconductor laser facet, the divided active layer of each divided unit semiconductor laser is disposed closer to the side surface of the divided unit semiconductor laser facing the adjacent column than to the center of the facet, and further, one end of the divided active layer is exposed to the side surface.

Figure 6:
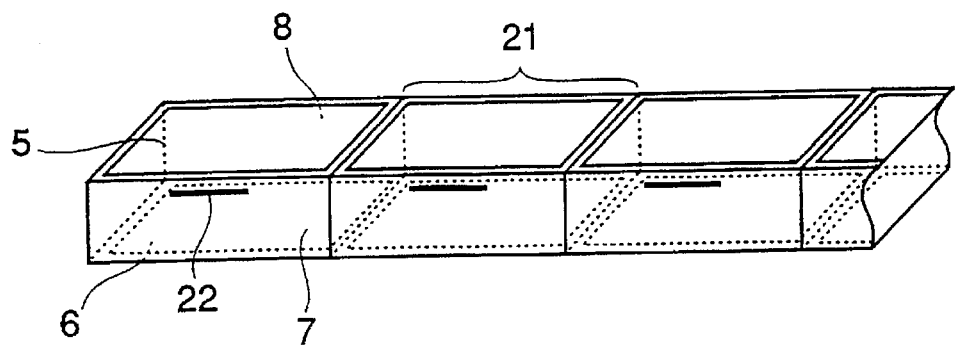
FIGS. 6(a)–6(c) are perspective views illustrating process steps in a method of fabricating an array type semiconductor laser device in accordance with the third embodiment of the invention.
Figure 6:
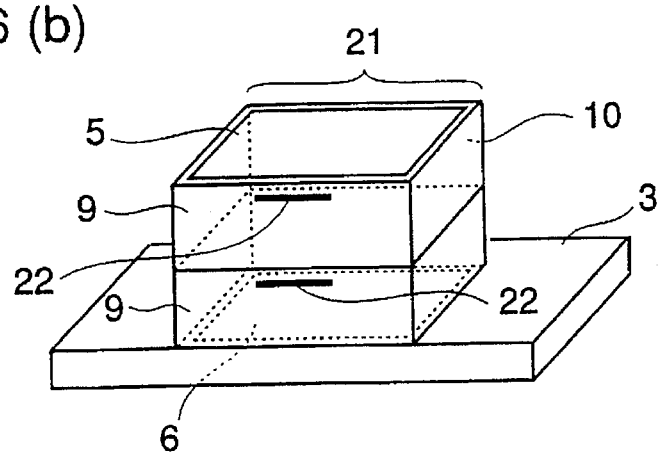
Figure 6:
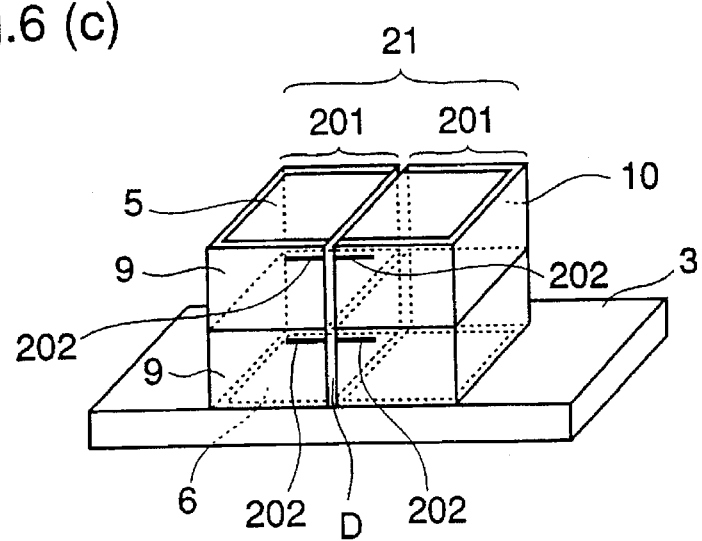

FIGS. 6(a)–6(c) are perspective views illustrating process steps in a method of fabricating an array type semiconductor laser device. Initially, a semiconductor wafer including semiconductor lasers is laminated on a substrate. After the rear surface of the substrate is ground, a front surface electrode 5 is formed on the front surface of the semiconductor wafer and a rear surface electrode 6 is formed at the rear surface. Then, as shown in FIG. 6(a), a semiconductor laser bar in which a plurality of unit semiconductor lasers 21 having the same structure are arranged in an array is cut out of the semiconductor wafer. The unit semiconductor lasers arranged in an array are in contact with each other at their side surfaces. In this case, an active layer 22 of the unit semiconductor laser 21 is located at the center of the facet. In addition, the widths of the unit semiconductor laser and the active layer are about twice as wide as in the prior art. The facets on the front and back sides in the figure are called a front facet 7 and a back facet 8, respectively.

A low-reflectance film 9 is deposited by evaporation on the front facet 7 of the semiconductor laser bar, and a high-reflectance film 10 is deposited by evaporation on the back facet 8. In a laser producing light having a wavelength of 1.55 µm, an alumina ($Al_2O_3$) film can be used as a low-reflectance film, and a film comprising two layers, alumina and amorphous silicon, can be used as a high-reflectance film.

After cutting the unit semiconductor lasers 21 out of the semiconductor laser bar, in the step of FIG. 6(b), a column comprising two unit semiconductor lasers 21 laminated with the front surface electrode 5 upward and the rear surface electrode 6 downward is formed on a submount 3. The submount 3 and the unit semiconductor laser 21 or the unit semiconductor lasers 21 are bonded using AuSn solder. In this structure, the facets on which the low-reflectance film 9 is deposited are in the same plane.

In the step of FIG. 6(c), the column comprising the laminated unit semiconductor lasers 21 is cut at the plane passing through the center of each active layer 22, using a dicing saw or a diamond wheel, whereby the unit semiconductor laser 21 and active layer 22 are divided respectively into two by a cutting groove D shown in the figure. Therefore, as is known from the figure, the divided active layer 202 is located closer to the side surface of the divided unit semiconductor laser 201 facing the adjacent column than to the center of the facet, and one end of the divided active layer 202 is exposed at the inner side surface. In addition, the facet of the divided unit semiconductor laser 201 on the front side is the facet on which the low-reflectance film 9 is deposited and the facet on the back side is the facet on which the high-reflectance film 10 is deposited. Finally, bonding of wires 4 is performed, resulting in an array type semiconductor laser device shown in FIG. 5.

In an array type semiconductor laser device according to the third embodiment of the invention, when a forward bias voltage is applied across the upper front surface electrode 5 of each column comprising the divided unit semiconductor lasers 201 and the submount 3, a current flows between the electrode and the submount, whereby laser oscillation occurs at the divided active layer 202 of the divided unit semiconductor laser 201 and laser light is emitted from the facet on which the low-reflectance film 9 is deposited.

In this third embodiment of the invention, since the divided active layer 202 is located closer to the side surface of the divided unit semiconductor laser 201 facing the adjacent column than to the center between the outside side surfaces, it is possible to narrow the space between the light emitting points, as compared with the prior art array type semiconductor laser device shown in FIG. 9(c). In fact, the space between the side surfaces of the respective divided unit semiconductor lasers of two columns facing each other, i.e., the width of the cutting groove, is about 100 µm, and the width of the divided unit semiconductor laser 201 is 300 µm. Therefore, assuming that the central point of the divided active layer 202 is closer to the side surface of the divided unit semiconductor laser 201 facing the adjacent column than to the center between the outside side surfaces by 100 µm, the space between the light emitting points in the horizontal direction becomes 200 µm. Thus, space can be narrowed not only by 200 µm as compared with the prior art shown in FIG. 9(c) but by 100 µm as compared with the first embodiment. Consequently, the light emitting region can be narrower than in the prior art and the first embodiment of the invention, whereby the collection of the emitted light using a lens is facilitated.

In addition, since two unit semiconductor lasers 21 are vertically laminated, the kinds of solder having different melting points when four unit semiconductor lasers are vertically laminated according to the prior art can be reduced by half, simplifying the solder bonding. In the third embodiment of the invention, the four portions bonded with solder in the first embodiment are decreased to two, whereby the process for the bonding is simplified. Further, since it is not necessary to divide the semiconductor laser bar into first and second bars as in the first embodiment, the process is made easier. Meanwhile, since one unit semiconductor laser 21 is about twice as large as the prior art unit semiconductor laser, the handling of the chip in the bonding process is easier than in the prior art. Since the divided unit semiconductor laser 201 is the same size as the prior art, the heat radiation is the same as the prior art.

Embodiment 4

Figure 7:
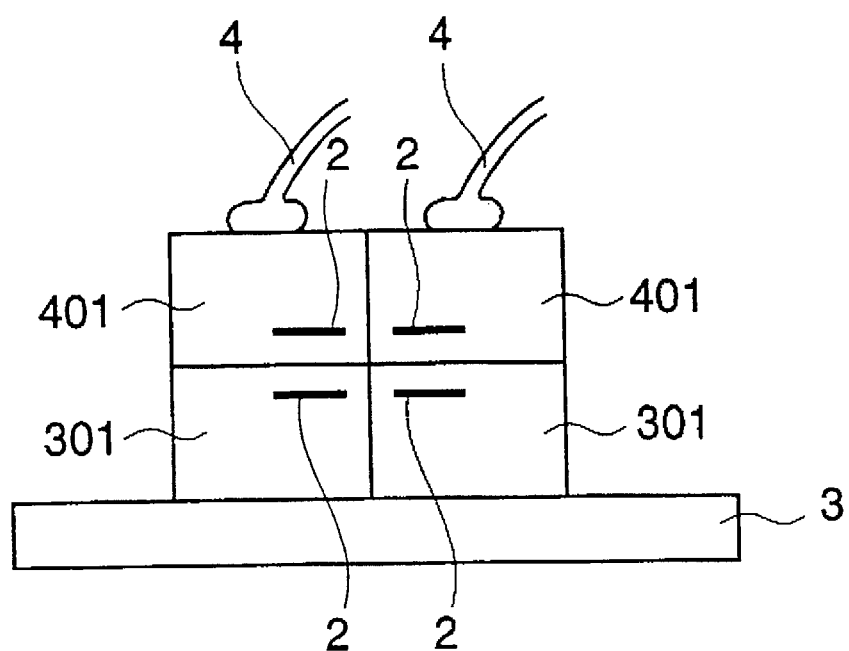
FIG. 7 is a front view illustrating an array type semiconductor laser device in accordance with a fourth embodiment of the present invention.

FIG. 7 is a front view illustrating an array type semiconductor laser device according to the fourth embodiment of the invention. In the figure, reference numerals 301 and 401 designate unit semiconductor lasers comprising semiconductor layers disposed on p type and n type semiconductor substrates, respectively. Reference numeral 2 designates an active layer, numeral 3 designates a submount, and numeral 4 designates a wire. Although the unit semiconductor lasers are disposed as in the array type semiconductor laser device of the second embodiment of the invention, the positions of the active layers of the unit semiconductor lasers are different. More specifically, each active layer is disposed closer to the side surface of the unit semiconductor laser in contact with the adjacent unit semiconductor laser than to the center of the facet. The active layer of the lower unit semiconductor laser 301 is located above the center of the facet, the active layer of the upper unit semiconductor laser 401 is located below the center of the facet.

Figure 8:
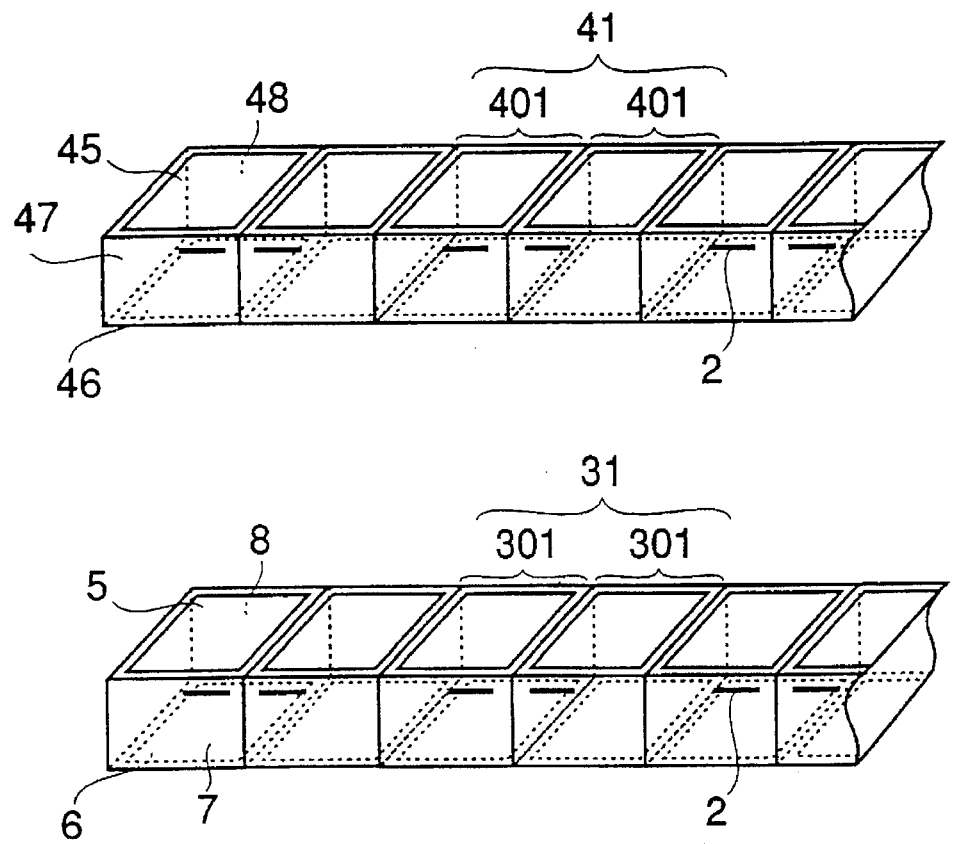
FIGS. 8(a) and 8(b) are perspective views illustrating process steps in a method of fabricating an array type semiconductor laser device in accordance with the fourth embodiment of the invention.
Figure 8:
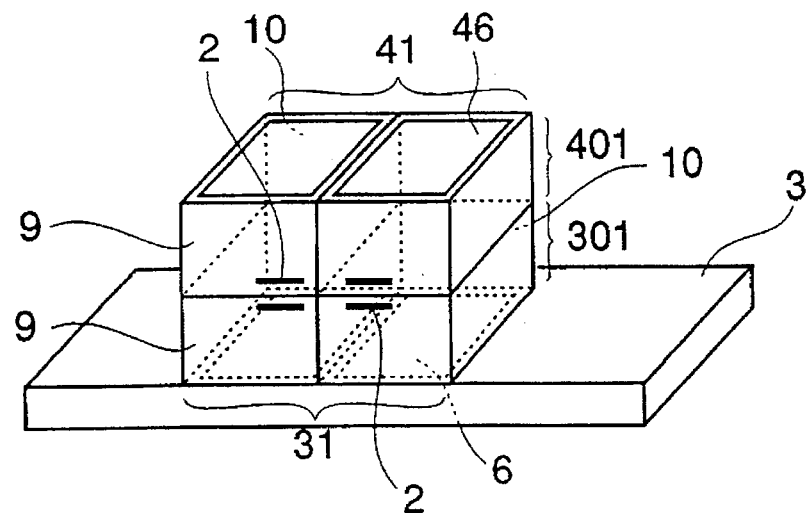

FIGS. 8(a) and 8(b) are perspective views illustrating process steps in a method of fabricating an array type semiconductor laser device. Initially, semiconductor wafers including semiconductor lasers are laminated on p type and n type substrates, respectively. After the rear surfaces of the substrates are ground, front surface electrodes 5 and 45 are formed on the respective front surfaces of the semiconductor wafers and rear surface electrodes 6 and 46 are formed at the respective rear surfaces.

As shown in FIG. 8(a), semiconductor laser bars in which a plurality of unit semiconductor lasers 301 and 401 are arranged in an array are cut out of the respective semiconductor wafers, thereby forming a facet of each unit semiconductor laser. The unit semiconductor lasers arranged in an array are in contact with each other at the side surfaces. In the figure, the semiconductor laser bar comprising the unit semiconductor lasers 301 is cut out of the semiconductor wafer on the p type substrate, and the semiconductor laser bar comprising the unit semiconductor lasers 401 is cut out of the semiconductor wafer on the n type substrate.

In the two kinds of semiconductor layers of the unit semiconductor lasers, the conductivity type of the semiconductor layers, except active layers, are opposite to each other. In this case, the lamination of the semiconductor layers and the formation of the front and rear surface electrodes are carried out so that active layers 2 of the respective unit semiconductor lasers are located at the front surface electrode side and closer to the interface between the adjacent unit semiconductor lasers of each pair than to the centers of the facets of the respective unit semiconductor lasers. The facets on the front sides are called front facets 7 and 47 and the facets on the back sides are called back facets 8 and 48. Low-reflectance films 9 are deposited by evaporation on the front facets 7 and 47, and high-reflectance films 10 are deposited by evaporation on the back facets 8 and 48. As in the first embodiment, in a laser producing light having a wavelength of 1.55 µm, an alumina ($Al_2O_3$) film can be used as a low-reflectance film, and a film comprising layers of alumina and amorphous silicon can be used as a high-reflectance film. Then, opposing type semiconductor laser chips 31 and 41 comprising the semiconductor layers on the p type and n type substrates, each chip comprising two unit semiconductor lasers that are adjacent to each other and in which the active layers 2 are located close to the respective side surfaces of the unit semiconductor lasers in contact with each other, are cut out of the semiconductor laser bars, respectively.

In the step of FIG. 8(b), the opposing type semiconductor laser chip 31 is formed on a submount 3 with the front surface electrode 5 upward and the rear surface electrode 6 downward, and the opposing type semiconductor laser chip 41 is formed on the laser chip 31 with the front surface electrode 45 downward and the rear surface electrode 46 upward. In this structure, the facets on which the low-reflectance films 9 are deposited are in the same plane. Therefore, as is shown in the figure, the active layer 2 is closer to the side surface of the unit semiconductor laser in contact with the adjacent unit semiconductor laser than to the center between both side surfaces. In addition, the facet of the unit semiconductor laser on the front side is the facet on which the low-reflectance film 9 is deposited and the facet on the back side is the facet on which the high-reflectance film 10 is deposited.

The submount 3 and the opposing type semiconductor laser chip 31 or the opposing type semiconductor laser chips 31 and 41 are bonded using AuSn solder. Finally, bonding of wires 4 is performed, resulting in an array type semiconductor laser device shown in FIG. 7.

In an array type semiconductor laser device according to the fourth embodiment of the invention, when a forward bias voltage is applied across the rear surface electrode 46 of the opposing type semiconductor laser chip 41 and the submount 3, a current flows between the electrode and the submount, whereby laser oscillation occurs at the active layer 2 of the unit semiconductor laser and laser light is emitted from the facet on which the low-reflectance film 9 is deposited.

In this fourth embodiment of the invention, as in the second embodiment of the invention, since the active layer 2 is located closer to the side surface of the unit semiconductor laser, in contact with the adjacent unit semiconductor laser, than to the center between the outside side surfaces, it is possible to narrow the space between the light emitting points, as compared with the array type semiconductor laser devices of the prior art shown in FIG. 9(c) and of the first embodiment of the invention. In fact, although the width of the unit semiconductor laser is 300 µm as in the first embodiment, while in the first embodiment the space between the side surfaces of the respective unit semiconductor lasers of two columns facing each other is 100 µm, in this fourth embodiment these side surfaces are in contact with each other. Therefore, assuming that the central point of the active layer 2 is closer to the side surface of the unit semiconductor laser in contact with the adjacent unit semiconductor laser than to the center between both outside side surfaces by 50 µm, the space between the light emitting points in the horizontal direction becomes 200 µm, so that the space is narrowed not only by 200 µm as compared with the prior art shown in FIG. 9(c) but by 100 µm as compared with the first embodiment.

Since the active layer of the lower unit semiconductor laser 301 is disposed above the center of the facet and the active layer of the upper unit semiconductor laser 401 is disposed below the center of the facet, the space between the active layers in the vertical direction becomes narrower than those in the first to third embodiments of the invention. Consequently, in the array type semiconductor laser device of the fourth embodiment of the invention, the light emitting region can be narrower than in the prior art and the first to third embodiments, whereby collection of the emitted light using a lens is facilitated.

In addition, since two opposing type semiconductor laser chips are vertically laminated, the kinds of solder having different melting points when four unit semiconductor lasers are vertically laminated according to the prior art can be reduced by half, simplifying the solder bonding process. In the fourth embodiment of the invention, the four portions bonded with solder in the first embodiment are decreased to two, whereby the process for bonding is simplified. Further, since it is not necessary to divide the semiconductor laser bar into first and second bars as in the first embodiment, processing is easier.

Furthermore, since it is not necessary to cut all unit semiconductor lasers as in the first embodiment and the portions for cutting the opposing type semiconductor laser chips are reduced by half, the cutting process is simplified. Meanwhile, since one opposing type semiconductor laser chip is twice as large as the prior art unit semiconductor laser, the handling of the chips in the bonding process is easier than in the prior art. Since the unit semiconductor laser is the same size as the prior art, the heat radiation is the same as the prior art.

In the fourth embodiment of the invention, although the opposing type semiconductor laser chip 31 comprising the semiconductor laser on the p type substrate is disposed on the submount 3 and the opposing type semiconductor laser chip 41 comprising the semiconductor laser on the n type substrate is disposed on the laser chip 31, these laser chips may be reversed, i.e., the opposing type semiconductor laser chip 41 may be disposed on the submount 3 and the opposing type semiconductor laser chip 31 may be disposed on the laser chip 41.

Further, although opposing type semiconductor laser chips are employed in the fourth embodiment of the invention, it is possible to apply the method of the fourth embodiment to the process for laminating laser chips comprising the single unit semiconductor lasers as in the first embodiment. More specifically, the conductivity type of the semiconductor layers of the upper and lower unit semiconductor lasers in each column may be reversed, whereby an array type semiconductor laser can be fabricated so that the active layer of the upper unit semiconductor laser is disposed below the center of the facet and the active layer of the lower unit semiconductor laser is disposed above the center of the facet. Therefore, the light emitting region can be narrower than in the first embodiment. However, the array type semiconductor laser in which the adjacent unit semiconductor lasers are in contact with each other at the side surfaces as in the fourth embodiment has the narrowest light emitting region.

What is claimed is:

1. A semiconductor laser device including:

a plurality of unit semiconductor lasers, each unit semiconductor laser having facets, side surfaces, and an active layer so that ends of the active layers are exposed at the facets, the facets having centers and light emitting regions of the active layer offset from the centers, the unit semiconductor lasers being arranged in two adjacent columns, each column comprising two unit semiconductor lasers directly bonded to each other at a common junction, the unit semiconductor lasers in each column being laminated so that light is emitted from each of the unit semiconductor lasers in the same direction, wherein each light emitting region of each unit semiconductor laser is located at a position closer to the adjacent column than to the center of the facet of the unit semiconductor laser and the light emitting regions of the unit semiconductor lasers in each column are commonly offset from the center of the facet in opposite directions with respect to the common junction.

2. The semiconductor laser device of claim 1 wherein the unit semiconductor lasers of the adjacent columns are in contact with each other at respective side surfaces.

3. A method of fabricating a semiconductor laser device including:

preparing a unit semiconductor laser structure having front and rear surfaces and including a plurality of unit semiconductor lasers;

forming a front surface electrode on the front surface of the unit semiconductor laser structure and forming a rear surface electrode on the rear surface of the unit semiconductor laser structure;

cutting the unit semiconductor laser structure to form facets of each unit semiconductor laser and to form a semiconductor laser bar having front and back facets and in which the unit semiconductor lasers are arranged in an array, serially in contact at side surfaces, an active layer of each unit semiconductor laser being located in the center of each facet of each unit semiconductor laser with respect to the side surfaces of the unit semiconductor laser;

depositing a low-reflectance film on the front facet of the semiconductor laser bar and depositing a high-reflectance film on the back facet of the semiconductor laser bar;

cutting the semiconductor laser bar into the plurality of unit semiconductor lasers;

laminating in a column on a submount at least two of the unit semiconductor lasers, including bonding the unit semiconductor lasers to each other so that the facets on which the low-reflectance film is deposited are in the same plane; and cutting the laminated unit semiconductor lasers at a plane passing through the center of the column of unit semiconductor lasers and parallel to the side surfaces, thereby forming a semiconductor laser device comprising a plurality of divided unit semiconductor lasers emitting light in the same direction and laminated in two columns.

4. A method of fabricating a semiconductor laser device including:

preparing first and second unit semiconductor laser structures, each structure including a plurality of unit semiconductor lasers, having front and rear surfaces, and having interfaces between unit semiconductor lasers;

forming front surface electrodes on the front surfaces of the unit semiconductor laser structures and forming rear surface electrodes on the rear surfaces of the unit semiconductor laser structures, an active layer of each unit semiconductor laser being located closer to the front surface electrode than to the rear surface electrode and the conductivity types of semiconductor layers of the first and second unit semiconductor laser structures between the front and rear surface electrodes, except the active layers, being opposite to each other;

cutting the first and second unit semiconductor laser structures to form facets of each unit semiconductor laser and to thereby form first and second opposing semiconductor laser bars having front and back facets, respectively, and in which the unit semiconductor lasers are serially arranged in an array with adjacent pairs of unit semiconductor lasers in contact at respective interfaces, each adjacent pair of the unit semiconductor lasers having active layers located closer to the interface between the adjacent pair of unit semiconductor lasers than to other interfaces of the respective semiconductor laser bars;

depositing a low-reflectance film on the front facets of the opposing semiconductor laser bars and depositing a high-reflectance film on the back facets of the opposing semiconductor laser bars;

cutting the first and second opposing semiconductor laser bars at interfaces remote from the active layers of the adjacent pairs of the unit semiconductor lasers to form first and second opposing semiconductor laser chips, respectively, each chip comprising an adjacent pair of the unit semiconductor lasers; and bonding the first semiconductor laser chip that is cut from the first semiconductor laser bar at the rear surface electrode to a submount and bonding the second semiconductor laser chip that is cut from the second semiconductor laser bar at the front surface electrode directly to the front surface electrode of the first semiconductor laser chip so that the facets of the first and second laser chips on which the low-reflectance film is deposited are in the same plane.

5. The semiconductor laser device of claim 1 wherein each of the light emitting regions of each unit semiconductor laser in each column is offset from the center of the facet of the unit semiconductor laser toward the common junction.

* * * * *